United States Patent [19]

Tanaka et al.

[11] Patent Number: 5,374,502
[45] Date of Patent: Dec. 20, 1994

[54] RESIST PATTERNS AND METHOD OF FORMING RESIST PATTERNS

[75] Inventors: Toshihiko Tanaka; Mitsuaki Morigami; Iwao Higashikawa; Takeo Watanabe, all of Tokyo, Japan

[73] Assignee: SORTEC Corporation, Tokyo, Japan

[21] Appl. No.: 83,131

[22] Filed: Jun. 25, 1993

Related U.S. Application Data

[63] Continuation-in-part of Ser. No. 964,715, Oct. 22, 1992.

[30] Foreign Application Priority Data

Apr. 23, 1992 [JP] Japan .................................. 4-129326
May 13, 1992 [JP] Japan .................................. 4-146873
May 13, 1992 [JP] Japan .................................. 4-146874
Jul. 7, 1992 [JP] Japan .................................. 4-201879

[51] Int. Cl.$^5$ .............................................. G03C 5/00
[52] U.S. Cl. ..................................... 430/322; 430/323; 430/325; 430/156; 430/270; 430/311; 430/396; 430/494
[58] Field of Search ................ 430/322, 323, 325, 156, 430/270, 311, 396, 494

[56] References Cited

PUBLICATIONS

Microelectronic Engineering 13 (1991) pp. 85–88, Elsevier.

Primary Examiner—John Kight, III
Assistant Examiner—Duc Truong
Attorney, Agent, or Firm—Nields & Lemack

[57] ABSTRACT

In accordance with a proposed resist pattern forming method, contact angles between the surface of a resist and a rinse is adjusted within a predetermined range, a volatil surfactant which does not remain by drying is mixed in the rinse so as to reduce a surface tension, the rinse is dried under a critical condition of the rinse in order not to cause the surface tension to exert. The occurrence of an attractive force between the resist patterns may be thereby weakened or nullified, so that falling of the patterns can be effectively prevented which very often happened at forming fine resist patterns or resist patterns of high aspect. On the other hand, depending upon structure of said resist pattern, it is possible to effectively prevent outermost main patterns of gathering resist patterns from falling down. By providing such effects, yieldings of products are increased. Further, the present invention may be also applied to a lithography illumination sources of which are light, electron, X-ray, ion beam, etc.

2 Claims, 6 Drawing Sheets

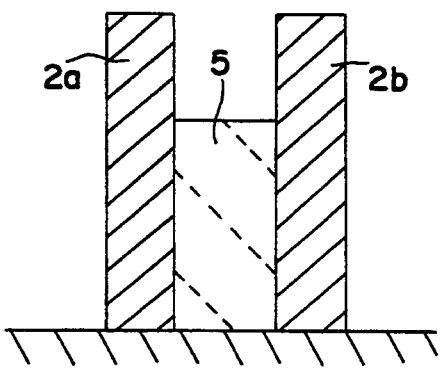
F I G. 1
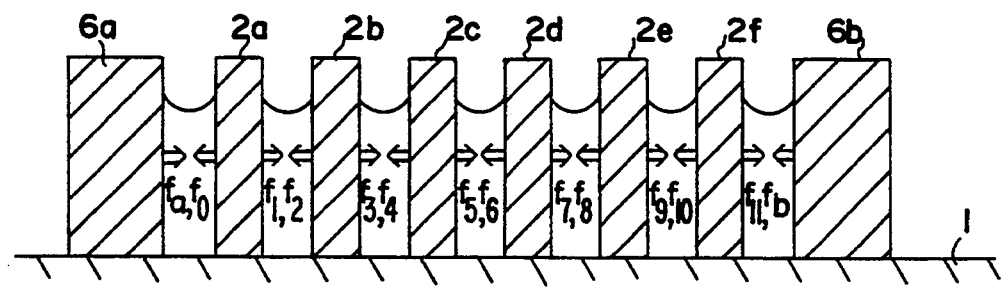
F I G. 2
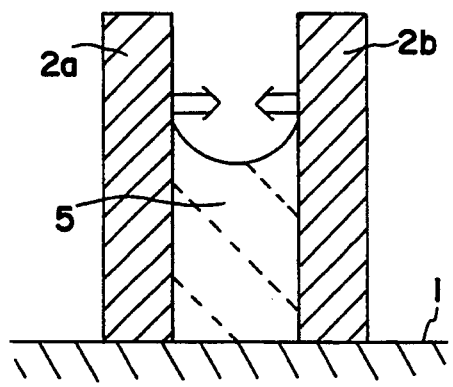
F I G. 3

RESIST PATTERNS AND METHOD OF FORMING RESIST PATTERNS

This application is a continuation-in-part of application Ser. No. 07/964,715, filed Oct. 22, 1992.

TECHNICAL FIELD OF THE INVENTION

The present invention relates to resist patterns for producing ULSI, semi-conductor device, surface acoustic wave device, quantum effect device, superconducting device, micro machine parts (micro gear, etc.), electronic circuit parts, photoelectron device and others, as well as a method of forming such resist patterns, and in particular the invention is to provide a pattern forming method and a structure thereof, by which the patterns can be effectively prevented from falling down when forming fine patterns or patterns of high aspect ratios.

PRIOR ART

As being along with requests for high integration of ULSI, formings of ultimately fine resist patterns have been demanded, and many hard studies have been made on the formings of the resist patterns having 0.2 to 0.3 $\mu$m minimum dimensions, and some up-to-date studies aim at a 0.1 $\mu$m minimum dimension. Line widths of the resists patterns are designed in accordance with integration degrees of a memory, for example, to be 0.35 $\mu$m for 64 MDRAM, or 0.25 $\mu$m for 256 MDRAM, and further said patterns are normally placed at the same distance as said line widths. Moreover, since the patterns of the same patterns are repeatedly formed till peripheries of the pattern forming area, said resist patterns are closely placed in pattern forming areas. On the other hand, studies have been also made on forming methods of fine patterns with large thickness. For example, for producing the micro machine, technical developments have progressed which form resist patterns of very high aspect ratio by means of the resist with the large thickness (e.g., 100 $\mu$m).

As exposure methods of the resist patterns, various irradiation sources are employed such as ultraviolet lamp with g line or i line, an excimer laser of KrF or ArF, or electron beam, ion beam or X rays. For developments thereof, a wet developing method which uses a developing liquid (developer) is mainly used. Since the wet development exhibit clean treatments because it includes washing with a rinse together with a merit of easy processing, it will be prospectively improved and developed.

FIG. 9 shows one example of conventional resist pattern forming processes for carrying out the wet developing method when developing the resist pattern. As seen in (a) of the same, a resist 2 is coated on a substrate 1, and a mask 3 formed with a desired pattern is brought nearby the resist 2 as shown in (b) of the same so as to expose said pattern, or expose said pattern through a lens (not shown). The ultraviolet ray, deep ultraviolet ray, X-ray, electron beam or ion beam may be used as the exposure rays. Further, as shown in (c) thereof, said resist 2 is immersed in a developer 4 so that resist patterns 2a are formed by utilizing difference in solving speeds of the resist 2 in a developer 4 between an exposure area and a non-exposure area. Thus, the developer and the resist solved in said developer are washed off by the rinse 5 as seen in (d). Finally, as shown in (e) of the same, the rinse is dried and the resist patterns 2a are completed. This drying is ordinarily made by a spin dry where the substrate 1 is rotated at high speed.

If the resist pattern is formed by the above mentioned method, in a case of the fine pattern (e.g., of pattern width of 0.2 $\mu$m or less) or the patterns of the high aspect (resist height/resist pattern width), as seen in FIG. 10(a), patterns 22a, 22b, 22c come close and gather at upper parts thereof, or as seen in FIG. 10(b), (c), close patterns 23a, 24a lean against others 23b 24b and fall down. Thus, the patterns more often fall down. In particular, such tendency is, as shown in FIG. 11, remarkable at outermost patterns 25a, 25g in the pattern forming area.

Accordingly, when devices are integrated at high density, or the fine patterns are disposed at fine spaces for producing compact products, desired resist patterns cannot be formed by the falling of the pattern, so that yield of products is reduced and reliability is lowered.

SUMMARY OF THE INVENTION

The present invention has been created in view of the above mentioned various problems of the prior art, and when forming the resist patterns, and especially when the close and fine resist patterns or the resist patterns of the high aspect ratio are formed, this invention is to provide a method of forming the patterns, by which the patterns can be effectively prevented from falling, and structure thereof so that products can be obtained at high yield.

BRIEF DESCRIPTION OF THE DRAWINGS

FIG. 1 is an explanatory view showing conditions of the resists, and the rinse which are adjusted at a most ideal contact angle in this invention;

FIG. 2 is a cross sectional view showing a basic structure of the resist patterns of the invention;

FIG. 3 is an explanatory view showing an ordinary condition of the resist and the rinse in the rinsing process;

Figure 4:
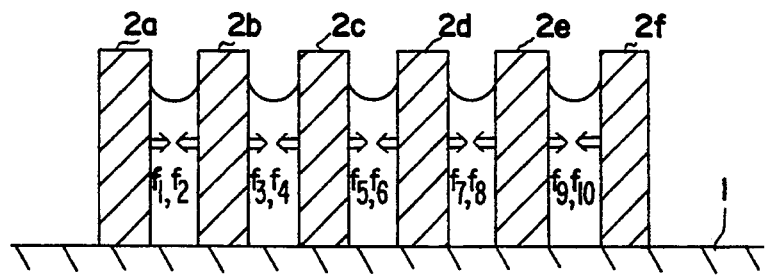
FIG. 4 is an explanatory view explaining causes why patterns at the outermost sides fall down.

Wherein, 1 . . . a substrate; 2 . . . resists; 2a-2f . . . 20a-20g, 21a-21g, 22a-22c, 23a, 23b, 24a, 25a-25b . . . resist patterns; 3 . . . a mask; 4 . . . a developer; 5 . . . rinse; and 6a, 6b, 60a, 61a 62a, 63a . . . dummy patterns.

MOST PREFERRED EMBODIMENT FOR PRACTISING THE INVENTION

Reference will be made in detail to progresses of the present invention.

It is apparent that the pattern of the resist falls down during a process between dropping of a developer and drying of a rinse, however at which step of the process it happens has not been cleared. Inventors pursued it, and found that when the rinse was dried, the resist pattern fell down. Further continuing the studies, the followings were cleared.

The resist (generally, based on novolak resin, styrene resin, or phenol resin) before a developing treatment has a hydrophobic property for the rinse (generally, water), however once it touches a developer (generally, alkaline solution), its surface is changed into a hydrophilic property. Hence, the rinse 5 stored between resist patterns $2a$ and $2b$ is, when dried, depressed in the surface as seen in FIG. 3. Pressure P at the interior of the rinse under such a condition is expressed with the following formula (1).

$$P = \sigma(1/R_1 + 1/R_2) \tag{1}$$

Being depressed in the surface, the pressure created within the rinse is negative, and an attractive exerts between the resist patterns $2a$ and $2b$ upon walls thereof. $\sigma$ is a surface tension of the liquid, $R_1$ and $R_2$ are radiuses of a main curvature (when the liquid surface is cut with a plane including a normal line standing at one point of the liquid surface, the radius of the curvature of said cut section is generally changed while the radius rotates on this planer and both extreme values thereof are the radiuses $R_1$ and $R_2$ of the main curvature).

Since, it was apparent that when an attractive force on a 0.2 μm line-and-space pattern (0.2 μm lines and spaces stand in rows alternately) was calculated, the surface tention $\sigma$ of the water at 23° C. was 72.28 dyn/cm, and when its contact angle was measured, it was 0, $R_1 = 0.2 \times 10^{-4}$ cm and $R_2 = \infty$ cm, and a negative pressure of about $7 \times 10^6$ dyn/cm$^2$ (about 7 kgw/cm$^2$) was created. It was seen that this negative pressure was a cause that the closely gathering pattern fell down. When the spaces between the patterns were small, the liquid surface drew a curve of a uniform curvature due to the surface tension. If the space between the patterns is $l$ and the contact angle is $\theta$, the radius of the main curvature is expressed with the following formula (2).

$$R_1 = l/(2\text{-}\cos\theta) \tag{2}$$

Accordingly, the negative pressure is expressed with the following formula (3), and the finer become the patterns, the stronger is the attractive force in inverse proportion to the pattern spaces.

$$P \propto 1/l \tag{3}$$

The finer become the patterns, the more fall down the patterns, and even such patterns of small film thickness (small aspect ratio) also fall down.

Hence, a basic idea of this invention is to reduce the negative pressure by making $R_1$ large. From the above formulas (1) and (2), the pressure P is expressed with the following formula (4), and if $\theta$ is 90°, that is, if a condition as shown in FIG. 1 is provided, the attractive force does not take place between the patterns.

$$P \approx (2\sigma\cos\theta)/l \tag{4}$$

Based on the above mentioned idea, the present invention may prevent the resist patterns from falling down by controlling said contact angle $\theta$ to be within a predetermined range from a later mentioned experiment result.

The resist pattern forming method of the present invention is basically characterized in that the rinsing treatment is carried out at 60° to 120° of the contact angle between the rinse and the surface of the resist treated with the developer in the rinsing process when developing the resist pattern.

A second and a third methods are to arbitrarily adjust the contact angle between the resist surface and the rinse, and the second method may adjust said contact angle by previously adjusting components (e.g., carbon, etc.) in the resist which components govern the hydrophobic property and the hydrophilic property of said resist with respect to the rinse to be used in the rinsing process.

Further, a third method uses the rinses of two or more kinds in the rinsing process, in which a first half process uses such a rinse which may change the property of the resist surface, so as to change the surface quality by exposing the resist patterns in the rinse for a predetermined time, thereby to adjust the contact angle in a rest half rinsing process.

Turning to the formula (4), a fourth method is to reduce the negative pressure P from another viewpoint. A basic idea thereof is to lower the surface tension $\sigma$ so as to reduce the pressure P for preventing the patterns from falling down. With respect to a concrete structure, the rinse to be used in the rinsing process is added with a surfactant for reducing said surface tension. The surfactant should be volatilized not to remain on the substrate by drying, because the remaining surfactant after the rinsing process makes stains.

Depending upon this method, since the surface tension of the rinse is lowered, the attractive force which will be caused when the rinse is dried, is largely reduced, and it is possible to prevent the fine resist pattern from falling down.

A fifth invention relates to a structure for reducing the surface tension $\sigma$, where a basic idea thereof is that the surface tension $\sigma$ does not exert upon the resist surface to restrain appearance of the negative pressure P for preventing the patterns from falling down. A concrete structure therefor is to dry the rinse under condition that the rinse (or a substituted liquid of said rinse) is made critical, and the attractive force is made 0, thereby to nullify the attractive force at drying and prevent the patterns from falling down.

In general, there is a condition (critical condition) which is neither liquid nor gas under a certain temperature-pressure called as a critical point. Under such a condition, there is not a liquid phase or a gas phase, and accordingly there is no interface and no surface tension. For performing the drying by utilizing such a condition, there is a critical point drying method. By bringing test pieces filled with the liquid to the critical state, not passing through the gas phase (not passing through a co-existence between the liquid phase and the gas phase), and subsequently bringing it to the gas phase, not passing through the liquid phase (similarly, not passing through the co-existence between the gas phase and the liquid phase), the rinse may be dried, not influenced by the surface tension. The structure of this fifth invention employs the critical point drying method when drying the rinse.

In accordance with this method, since the surface tension does not exert on the rinse when it is dried, the attractive force does not occur between the patterns, and the falling of the patterns may be prevented.

The above mentioned structure refers to the pattern forming method without falling of the patterns, however noticing actual fallings of the patterns, it is seen that the outermost patterns within the pattern forming area lean against others and fall down.

According to the inventors' studies, it is considered that the patterns fall down by the following causes. As is seen in FIG. 4, since the outermost patterns $2a$, $2f$ in the pattern forming area and given force ($f_1$, $f_{10}$) to one sides only, the force is not balanced to cause the falling of the patterns. On the other hand, at the patterns condensing parts ($2b$ to $2e$), the force acts thereon ($f_2$ and $f_3$, $f_4$ and $f_5$, $f_6$ and $f_7$, $f_8$ and $f_9$), and the force is balanced, so that the patterns do not fall down (the balance and imbalance of the force are assumed to cause in the width direction of the pattern, and sufficient distances are got in the length direction thereof, so that there is no problem about the balance and imbalance of the force).

A basic idea of the present invention is, as seen in FIG. 2, that dummy patterns $6a$, $6b$ are arranged around the area of the patterns $2a$ to $2f$ (called "main patterns" hereinafter) to be formed as resist patterns such that the surface tension ($f_0$ and $f_1$, $f_{10}$ and $f_{11}$) also acts on both sides of the main patterns $2a$, $2f$ so as to provide the balanced force and prevent the main patterns $2a$, $2f$ from falling down.

In the structure of the above resist patterns, the main patterns $2a$ to $2f$ are formed in the same widths, and the spaces between the patterns are all the same as said widths, and a majority of them are faced in the same direction. Thus, when the main pattern are regularly arranged, it is sufficient that the dummy patterns $6a$, $6b$ are disposed along both sides in length of at least the main patterns $2a$ to $2f$, and it is not required that the dummy patterns are disposed over a plurality of patterns $2a$ to $2f$.

When the main patterns $2a$ to $2f$ are regularly arranged as said above, and if the dummy patterns $6a$, $6b$ are formed at the same spaces as those between the main patterns $2a$ to $2f$, the surface tensions ($f_0$ and $f_1$, $f_{10}$ and $f_{11}$) acting on both sides of the main patterns $2a$ and $2f$ are made equal and balanced.

Since the dummy patterns $6a$, $6b$ themselves are effected with the forces $f_a$ and $f_b$ which pull toward the insides from one sides only, respectively, the dummy patterns $6a$, $6b$ occupy areas more largely than the main patterns $2a$ to $2f$ from viewpoint of preventing the dummy patterns $6a$, $6b$ from falling down. In other words, it is preferable that the aspect ratios of the dummy patterns are made smaller than those of the main patterns $2a$ to $2f$.

EXAMPLE 1

Actual examples of the first to the third invention methods will be explained in detail.

The resist containing carbons which were variously changed in the adding amounts were prepared, and several kinds of the resists were at first prepared so that the contact angles between the resist surfaces and the rinses were made different at the rinsing processing. Since the carbon had the hydrophobic property, said contact angles could be prepared in response to the carbon containing amounts.

Figure 5:
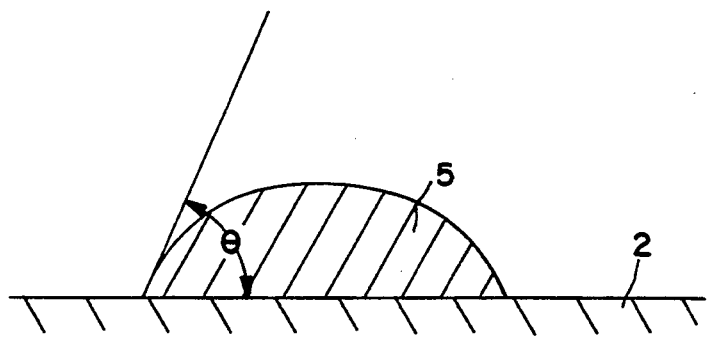
FIG. 5 is an explanatory view showing how the contact angle is measured.

These resists were subjected to coatings, heat-treatings, developings and rinsings in accordance with an ordinary lithography process. After once drying the rinse, the rinse was again dropped on the resists, and the contact angles $\theta$ between the resist surfaces and the rinses were measured as shown in FIG. 5. Herein, a liquid of tetramethylammonium hydroxide was used for the developer, and a water was used for the rinse (the developer is not limited tetramethylammonium hydroxide, however alkaline solution such as sodium hydroxide solution, potassium hydroxide solution, etc. may be used).

Figure 6:
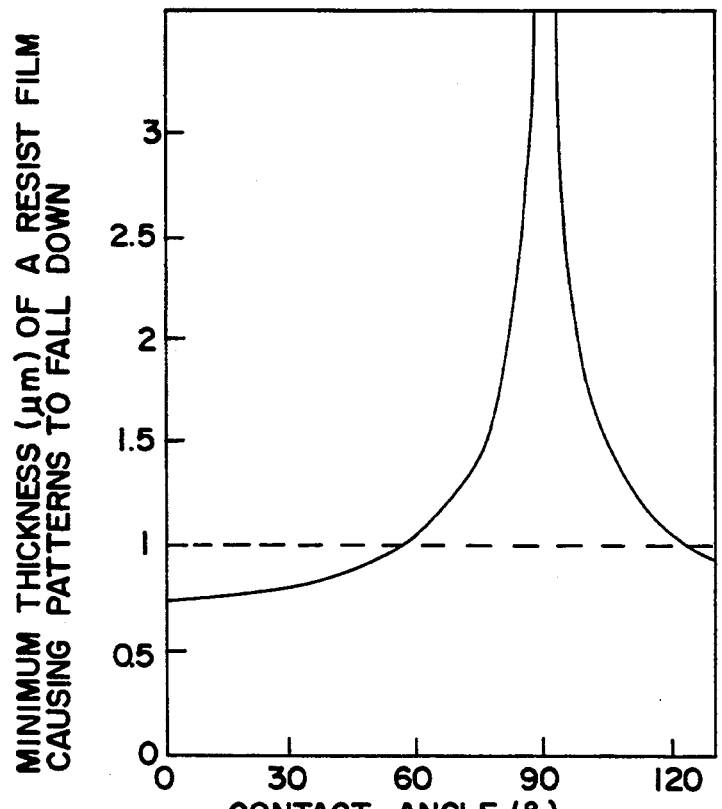
FIG. 6 is a graph showing a relationship between a minimum thickness of the resist and the contact angle, causing the falling of the pattern in a first EXAMPLE of the invention.

Investigations were made on a relation between the contact angle $\theta$ of a 0.15 $\mu$m line-and-space pattern and minimum thickness of the resist film causing the pattern to fall down. FIG. 6 shows results of the investigations.

For making LSI with a 0.15 $\mu$m level feature size pattern, 1-$\mu$m thick resist patterns are required. In order to form the resist pattern of such thickness so that it does not fall down, it is seen from FIG. 6 that the contact angles should be determined to be 60° to 120°. Further, in ranges over 75° to 105°, the critical curve of the resist film thickness where the pattern falls down stands steeply, and thus it is seen that the prevention of the pattern falling is remarkable in this range.

In general, if the line-and-space is designed with a 0.18 to 0.2 $\mu$m rule, it is possible to produce DRAM of 1 G bit, and if that is designed with a 0.13 to 0.18 $\mu$m rule, it is possible to produce DRAM of 4 G bit, and if that is designed with a 0.1 $\mu$m rule, it is possible to produce DRAM of 16 G bit and quantum effect device. Accordingly, for producing DRAM of a 4 G bit class, if said contact angle may be controlled within the range of 60° to 120°, the pattern will be effectively prevented from falling down.

Inventors' other experiments confirmed the similar effects to the above mentioned with an organic developer and an organic rinse for the developer and the rinse. When using, as the rinse, two or more kinds of isopropyl alcohol and the water, or isopropyl alcohol and Freon, no problems occurred if the contact angle could be settled within said range.

On the other hand, if an entire resist pattern is immersed in the rinse, the surface tension does not take place on the resist pattern, and when the resist partially appears at drying as seen in FIG. 1, the surface tension acts on. Therefore, it is sufficient that the requirement of said contact angle is satisfied in a last rinse.

EXAMPLE 2

Explanation will be made to an example of a fourth inventive method.

At first, PMMA as the resist was coated on the substrate, and baked at a temperature of 170° C. for 20 minutes.

Subsequently, a desired pattern was exposed with X-ray. A light source is not limited to X-ray, and an electron beam, ion beam or the deep ultraviolet ray may be employed.

The developments were made with a developer mixed at a ratio of 1 methylisobuthylketon (MIBK) to 3 of isopropylalcohol (IPA). The developing time was 3 minutes.

The rinsing was carried out with a rinse where said isopropylalcohol was mixed in the water, and dried by the spin dry. Since the isopropylalcohol was a volatile liquid, it did not remain on the substrate after volatilization.

The resist pattern of the thus formed 0.2 μm line-and-space pattern 1.3 μm thickness was observed with SEM (Scanning Electron Microscope). The resist patterns where only the water was used for the rinse caused the pattern-fallings, however those where the rinse mixed with the isoproplyalcohol did not cause the pattern-fallings.

Since also in this case, the surface tension acts on when the resist partially appear at drying the rinse, the surfactant should be contained in the last rinse to reduce the surface tension.

EXAMPLE 3

Explanation will be also made to a fifth inventive method.

At first, the resist is coated on the substrate as in the previous EXAMPLE, and was heat-treated (baked). The resist and the heat-treating conditions were the same as the previous one.

Subsequently, a desired pattern was exposed with X-ray. The light source is not limited to the X-ray, either, and the electron beam, the ion beam or the deep ultraviolet ray may be employed.

Also in this case, the developments were performed with a developer mixed at a ratio of 1 of methylisobuthylketon (MIBK) to 3 of isopropylalcohol (IPA). The developing time was 3 minutes.

The entire substrate was rinsed in the isopropylalcohol.

After that, the substrate was cooled down to about $-35°$ C., and the substrate which had the puddle like isopropylalcohol was placed in a pressure container filled with dry ice therewithin (that is, the substrate where the resist pattern was as a whole immersed in the rinse and the surface tension did not act on the resist pattern).

Successively, if the substrate was rapidly heated to 20° C., and a pressure is heightened not less than 70 kg/cm$^2$, the isopropylalcohol was replaced with a liquid $CO_2$.

The substrate was heated to 40° C. from said condition and brought to the critical point, and while $CO_2$ is changed into gas, this gas was slowly leaked, and the drying was finished.

The resist pattern of the thus formed 0.1 μm line-and-space pattern in 1 μm thickness was observed with SEM. The resist patterns which were formed by a prior art of drying the rinse by the spin dry caused the pattern-fallings, however the present drying the critical drying method did not cause occasions.

When the resist pattern is entirely immersed in the rinse as said above, the surface tension does not occur, and when apart of the resist appears, the surface tension exerts it. Therefore, the rinsing treatment should be carried out as the rinse covers over the entire resist pattern until immediately before drying of the critical point.

EXAMPLE 4

Figure 7:
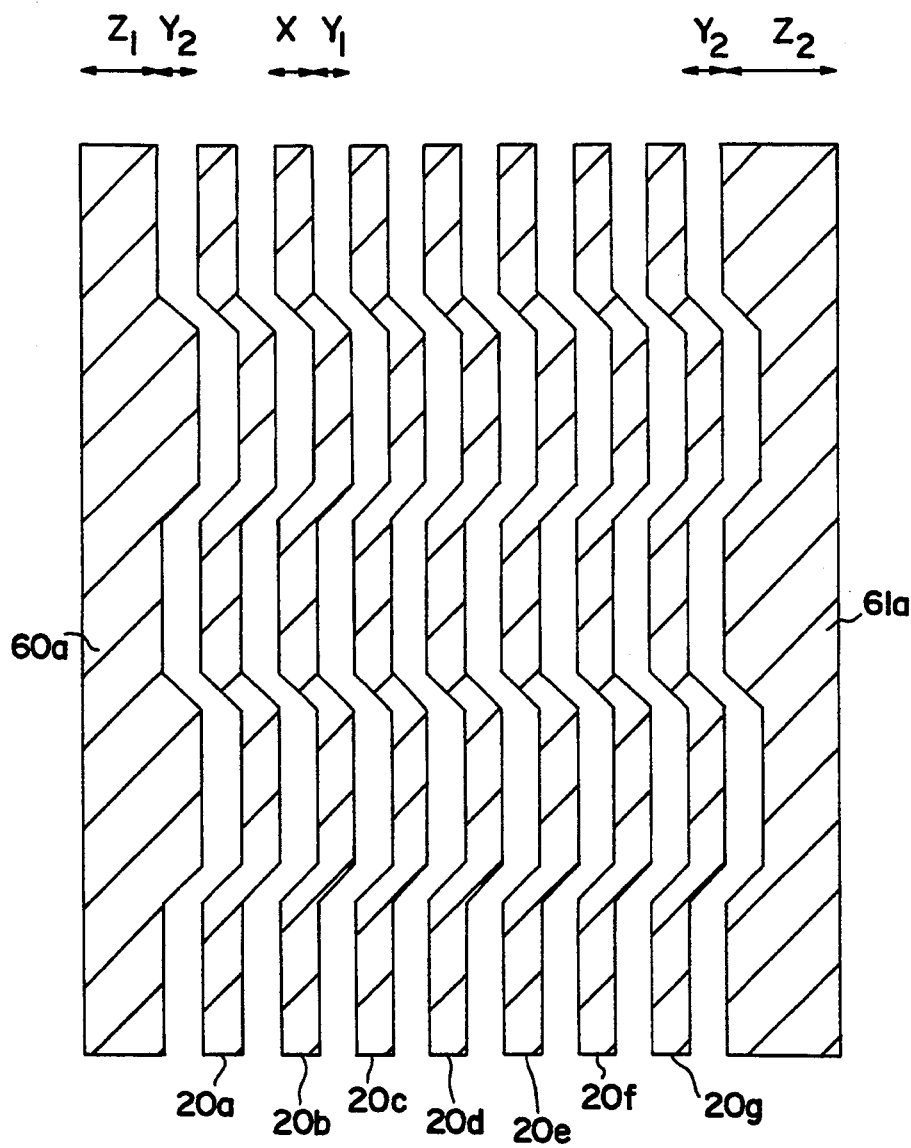
FIG. 7 is a plan view showing wiring patterns formed for obtaining the resist patterns relating to a fourth EXAMPLE of the invention.

Wiring patterns 20 (corresponding to the main patterns) of width X being 0.2 μm and space Y1 being 0.2 μm were laid out as in FIG. 7. At that time, patterns 60a, 61a corresponding to the dummy patterns are positioned at both sides of the wiring patterns 20. A space Y2 between the outermost wiring pattern 20a and the pattern 60a as well as the outermost wiring pattern 20g and the pattern 61a were determined to be 0.2 μm as the above stated space Y1, and the width Z1 of the pattern 60a was set to be 0.4 μm and the width Z2 of the pattern 61a was set to be 0.6 μm.

The exposure was performed by SOR irradiation to print said patterns to the resist of AZ-PN100 (Trade Name of Hoechst Corp.) of 1.3 μm film thickness.

After the development was made with the alkaline solution, the rinsing was done with the water, and the drying was done by the spin dry. The thus obtained resist patterns had the same shapes as the patters shown in FIG. 7.

Resist patterns of conventional structures without placing the dummy patterns were also formed other than the resist patterns provided in the above manner. With respect to the resist patterns of the conventional structure, the outermost main patterns (corresponding to those 20a, 20g) fell down, however the outermost main patterns (corresponding to them) obtained in this EXAMPLE could to prevented from falling down.

EXAMPLE 5

Figure 8:
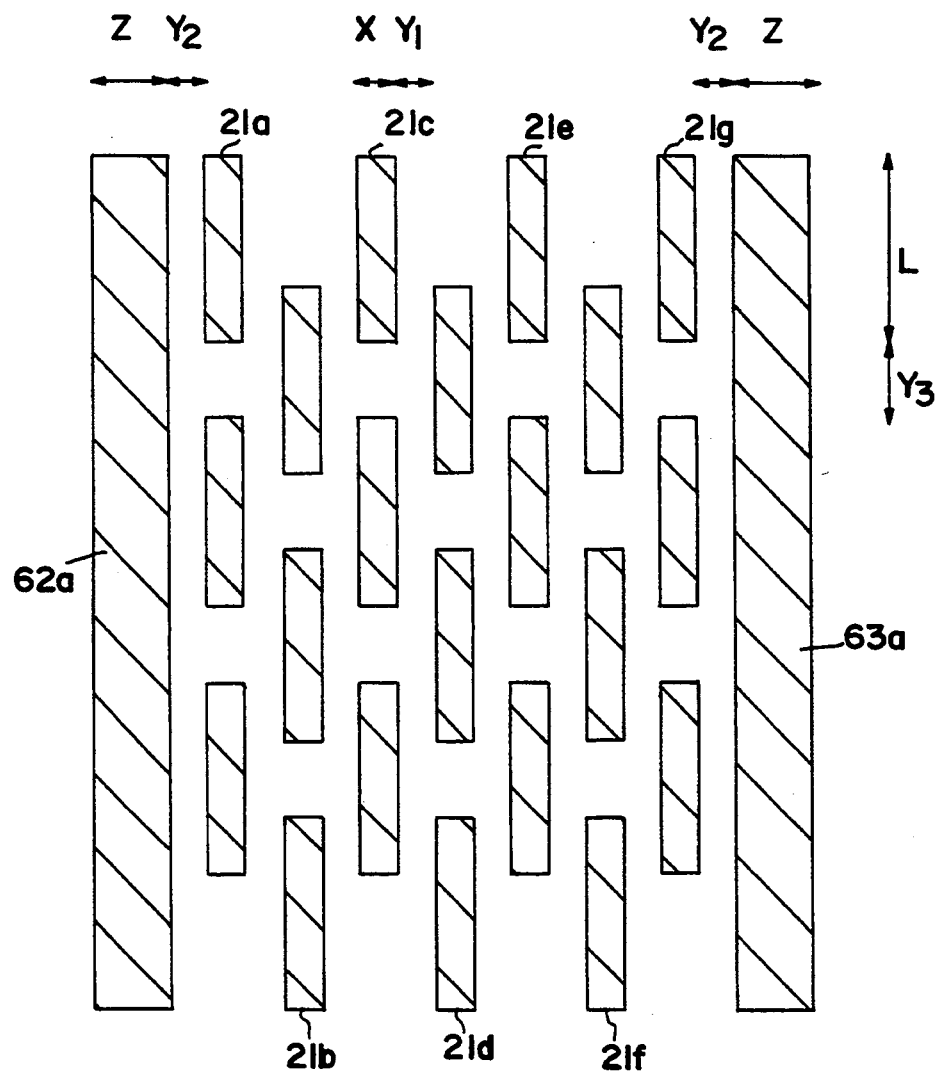
FIG. 8 is a plan view showing wiring patterns formed for obtaining the resist patterns relating to a fifth EXAMPLE of the invention.
Figure 9A:
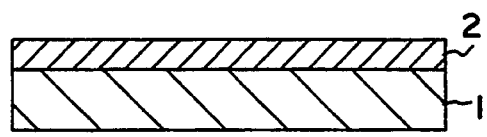
FIG. 9 is explanatory views showing a conventional resist pattern forming process.
Figure 9B:
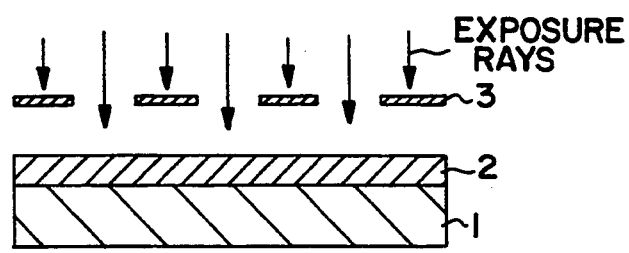
Figure 9C:
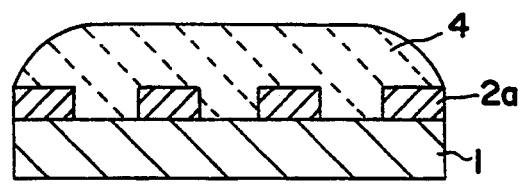
Figure 9D:
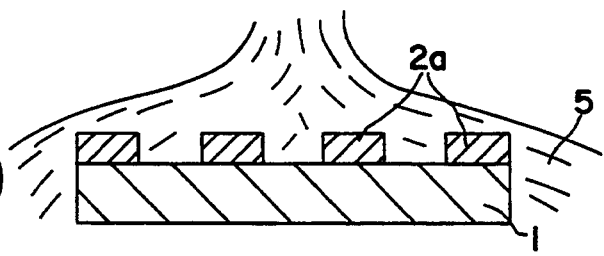
Figure 9E:
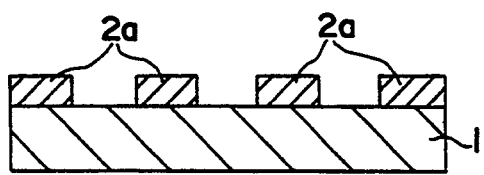
Figure 10A:
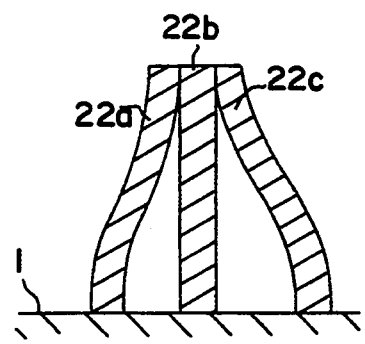
FIG. 10 is explanatory views showing representative falling conditions of the resist patterns.
Figure 10B:
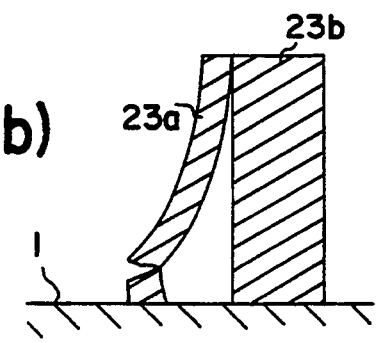
Figure 10C:
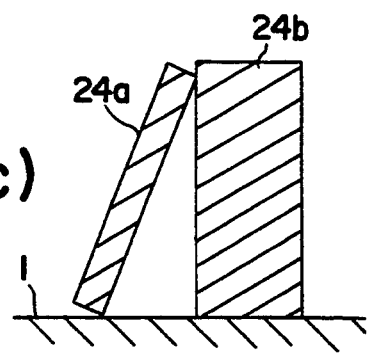
Figure 11:
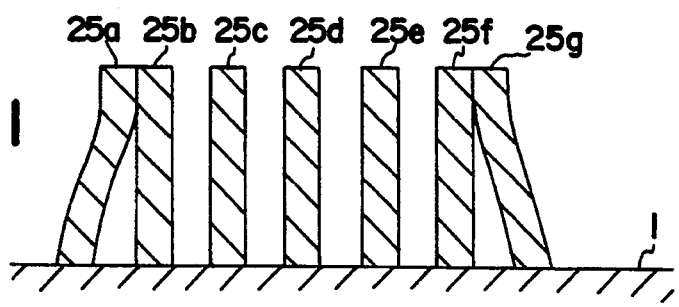
FIG. 11 is an explanatory view showing fallings of the outermost patterns in the pattern forming area.

Wiring patterns 21 (similarly corresponding to the main patterns) of 0.2 μm width, 0.2 μm space Y1, 1.0 μm length L, and 0.4 μm space Y3 were laid out as patterns to be printed on the resist later, as seen in FIG. 8. At that time, patterns 62a, 63a corresponding to the dummy patterns were placed at both sides of the wire patterns 21. A space between the outermost wiring pattern 21a and the pattern 62a as well as a space Y2 the outermost wiring pattern 21g and the pattern 63a were determined to be 0.2 μm as the above stated space Y1, and the width Z of these patterns 62a and 63a were 0.4 μm.

Said patterns were subjected to exposing, developing rinsing and drying as the previous EXAMPLEs, and resist patterns of the same shape as shown in FIG. 8 were obtained.

The resist pattern of the same shape as shown in FIG. 8 and of the conventional structures without disposing the dummer patterns were also formed, however the outermost main patterns (corresponding to 21a, 21g) fell down. On the other hand, the outermost main patterns (corresponding to 21a, 21g) of the resist patterns obtained in this EXAMPLE could be prevented from falling down.

EXAMPLE 6

A procedure was operated, comprising coating AZ-PN-100 (Trade mark of Hoechst Japan Limited) on the wafer, heat-treating at 120° C. for 2 min, exposing, again heat-treating at 110° for 2 min, immersing it for one minute in a developer where water was added to AZ312 developer (Trademark of Hoechst Japan Limited) and the mixture ratio (volume ratio) of water and AZ312 developer was 2:1, immersing it for 20 seconds in a rinsing liquid which was a mixture of water and tert-butyl alcohol $(CH_3)_3COH$ where the mixture ratio (volume ratio) was 1:1, and drying the rinsing liquid. The drying was spin drying in this embodiment, but not limiting to it, a nitrogen blowing was sufficient. As a result, a 0.2 μm line and space pattern of 1.2 μm thickness was made.

In contrast, in the ordinary way using the water for the rinsing liquid, the maximum thickness of the resist film not causing the pattern falling was 1 μm, and the 0.2 μm line and space pattern of the 1.2 μm thickness could not be formed.

Herein, the mixing volume ratio of the tert-butyl alcohol and the water was 1:1, and preferable effects were brought about in a range of 20:80 to 60:40. If the range of 60:40 was exceeded, such problems arose that parts of the resist were dissolved and shapes were degraded.

When ethanol or methanol were used for the tert-butyl alcohol, the resist pattern was dissolved, and when an isopropyl alcohol was added thereto, the resist was peeled. The mixture of the tert-butyl alcohol and the water was used, but not limiting thereto, such mixtures of water and any one of tert-amyl alcohol (($CH_3$)$_2$C(OH)CH$_2$CH$_3$), 2-methyl-1-butanol (CH$_3$CH$_2$CH(CH$_3$)CH$_2$OH), 1-butanol (CH$_3$(CH$_2$)$_3$OH), dl-2-butanol (CH$_3$CH$_2$CH(OH)CH$_3$), 3-pentanol (CH$_3$CH$_2$CH(OH) CH$_2$CH$_3$), and isobutyl alcohol were also effective, or the water and any multiple ones thereof.

In this practice, the wafer was at once, after developing, rinsed with the mixture of the tert-butyl alcohol and the water, but it was sufficient to once water-wash after developing, and rinse with the mixture of the tert-butyl alcohol and the water while it was not dried. In this way, the amount of the rinse liquid consumed was small, and the cost might be lowered. Further, since the immersing time of the resist in the mixture of the tert-butyl alcohol and the water is short, damages (partial dissolution) given to the resist could be avoided. Subsequently, the ratio of the tert-butyl alcohol could be heightened so that the falling of the pattern was made less. The tert-butyl alcohol served as a surfactant.

EXAMPLE 7

A procedure was operated, comprising coating SAL601 (Trademark of Shipley Microelectronics Limited) on the wafer, heat-treating at 125° C. for 2 min., exposing, again heat-treating at 115°C. for 2 min, immersing it for one minute in a developer of 2.3% NMD3 (Trademark of Tokyo Ohka Kogyo Co., Ltd.), immersing it for 20 seconds in a rinsing liquid where a tert-amyl alcohol was added to a water and the mixture ratio (weight ratio) between tert-amyl alcohol and water was 10:100, and spin-drying, and evaporating a small amount of the residual rinse liquid by the heat-treatment. In this embodiment, the heat-treating temperature was 80° C., but is not limited thereto. The higher was the temperature, the shorter was the evaporating time. However, if the temperature were too high, the resist pattern would be deformed. In this resist pattern, the deformation was recognized at the temperature of 150° C. In the ordinary way using the water for the rinsing liquid, the 0.2 μm line and space pattern of 1.1 μm thickness fell, but the falling could be prevented by the present way. The tert-amyl alcohol solution was less dried, but in the present way, damages thereby were not effected, and there were neither the rinsing liquid residual on the wafer nor causes of pollutions.

Herein, the mixture of the tert-amyl alcohol and the water was used for the rinsing liquid, but not limiting thereto, 2-methyl-1-butanol, 1-butanol, dl-2-butanol, tert-butyl alcohol, 3-pentanol, or isobutyl alcohol were added to the water so as to prepare a rinsing liquid, and good effects were brought about.

The mixture of the tert-amyl alcohol and the water was used for the rinse liquid, but not limiting thereto, the effect was obtained by adding 2-methyl-1-butanol, 1-butanol, dl-2-butanol, tert-butyl alcohol, 3-penthanol, or isobutyl alcohol to the water, and using it as the rinsing liquid.

It was also sufficient that the wafer was once water-washed, and rinsed, while not dried, with the mixture of the tert-amyl alcohol and the water, and the drying was carried out by the heating-treatment. The present method is particularly effective to the treatment of the resist using a novolak resin and a phenol resin. If the isopropylalcohol solution is used, it dissolves the resist pattern or causes peeling of the resist.

What is claimed is:

1. A method of forming resist patterns, wherein a rinse liquid to be used in a rinsing process when developing the resist patterns is a solution containing one or a plurality of tert-amyl alcohol, 2-methyl-1-butanol, 1-butanol, dl-2-butanol, tert-butyl alcohol, 3-penthanol, and isobutyl alcohol.

2. The method of claim 1, wherein a heating treatment is carried out after the rinsing.

* * * * *